US006970118B2

(12) United States Patent
Regier

(10) Patent No.: US 6,970,118 B2
(45) Date of Patent: Nov. 29, 2005

(54) HIGH-SPEED HIGH-RESOLUTION ADC FOR PRECISION MEASUREMENTS

(75) Inventor: Christopher G. Regier, Cedar Park, TX (US)

(73) Assignee: National Instruments Corporation, Austin, TX (US)

(*) Notice: Subject to any disclaimer, the term of this patent is extended or adjusted under 35 U.S.C. 154(b) by 297 days.

(21) Appl. No.: 10/388,296

(22) Filed: Mar. 12, 2003

(65) Prior Publication Data

US 2004/0034499 A1 Feb. 19, 2004

Related U.S. Application Data

(60) Provisional application No. 60/403,349, filed on Aug. 14, 2002.

(51) Int. Cl.[7] .............................................. H03M 1/06
(52) U.S. Cl. ...................... 341/118; 341/155; 341/144
(58) Field of Search ................................. 341/145, 144, 341/156, 139, 131, 127, 118, 120

(56) References Cited

U.S. PATENT DOCUMENTS

| 3,995,266 | A | * | 11/1976 | Muller et al. ............... 341/145 |
| 4,716,398 | A | | 12/1987 | Eccleston et al. |
| 5,117,227 | A | | 5/1992 | Goeke |
| 5,200,752 | A | | 4/1993 | Goeke |
| 5,565,869 | A | | 10/1996 | Brodie et al. |
| 5,781,137 | A | | 7/1998 | Knudsen |
| 5,930,745 | A | | 7/1999 | Swift |
| 6,243,034 | B1 | | 6/2001 | Regier |
| 6,525,531 | B2 | * | 2/2003 | Forrest et al. ........... 324/207.2 |
| 6,538,592 | B1 | * | 3/2003 | Yang et al. ................. 341/155 |

OTHER PUBLICATIONS

Norsworthy et al., "Delta-Sigma Data Converters," IEEE: ISBN 0-7803-1045-4, ©1997(Chapters 6-8), no month.
"5700A/5720A Series II Multi-Function Calibtaror," Fluke service manual Jun. 1996, (Chapter 2 and pp. 7-50, no month.

* cited by examiner

*Primary Examiner*—Brian Young
(74) *Attorney, Agent, or Firm*—Meyertons Hood Kivlin Kowert & Goetzel, P.C.; Jeffrey C. Hood

(57) ABSTRACT

A measurement device such as a DMM may include four basic units—an analog circuit path, an analog to digital converter (ADC), a digital filter, and an RMS computation unit. The four basic units may be operable to multiplex or to process one or more of the plurality of channels at the same time. The analog circuit path may include the necessary circuitry for the plurality of channels to couple to one or more analog signals. The analog circuit path may couple to the ADC. The ADC may be operable to receive the one or more analog signals from the analog circuit path and convert it to one or more digital signals. The ADC may include a cascaded ADC, which may include a first ADC and a second ADC. The first and the second ADC and may be able to convert analog data to digital data during a cycle. In one embodiment, the first ADC may generate a conversion result and an error signal. The second ADC may be operable to receive the error signal, digitize the error signal, and process the error signal, thus performing noise cancellation. A summation operation may combine the data from the first ADC and the processed data from the second ADC. The cascaded ADC may consist of a continuous-time 1-bit sigma-delta modulator followed by a SAR ADC. Digital output from sigma-delta modulator may be weighted and summed with the output of the SAR ADC in an FPGA.

49 Claims, 5 Drawing Sheets

HIGH-SPEED HIGH-RESOLUTION ADC FOR PRECISION MEASUREMENTS

PRIORITY CLAIM

This application claims benefit of priority of U.S. provisional application Ser. No. 60/403,349 titled "High-Speed High-Resolution ADC for Precision Measurements" filed Aug. 14, 2002, whose inventor was Christopher G. Regier.

FIELD OF THE INVENTION

The present invention relates to the field of computer-based test systems, and more particularly to a cascaded Analog-to-Digital Converter for precise measurements.

DESCRIPTION OF RELATED ART

Traditional DMMs

Traditional measuring instruments, such as DMMs, generally focus on resolution and precision, and do not offer high-speed acquisition capability. There may be inherent limitation in noise performance vs. speed, which is a function of basic physics. Johnson noise of a resistor is one example of a theoretical limit, and there are other practical limitations set by the semiconductor device technology. However, there are specialized high-resolution DMM with both high resolution and high speeds, but these are usually expensive, and available only in full-rack configurations that consume significant system and/or bench space.

Another DMM speed limitation is driven by the traditional hardware platform, i.e., the GPIB (IEEE 488) interface bus. This interface, in use since the 1970s, is often considered the standard for networking measuring instruments, despite tradeoffs in speed, flexibility, and cost. Many traditional box DMMs employ the GPIB interface, although there are alternative DMM interface standards being offered, such as USB and Ethernet. All of these interfaces communicate with the DMM by sending messages to the instrument and waiting for a response, which may be slower than computer-based plug-in modular instrumentation.

Even without the GPIB interface limitations, one of the DMM limitations in both speed and precision continues to be the analog-to-digital converters (ADCs) used in these products which convert an analog input signal to a digital signal.

Traditional DMM ADC Technologies

FIG. 1 (Prior Art)—Dual-Slope ADCs

From a historic perspective, one of the oldest but most common forms of precision A/D conversion is a Dual-Slope Analog-to-Digital Converter, also referred to herein as a dual-slope converter. This technique, illustrated in FIG. 1, has been widely used since the 1950s. It is essentially a two-step process. First, an input voltage (representing the signal to be measured) is converted to a current and applied to an input of an integrator through switch S1. When the integrator is connected to the input (at the beginning of an integration cycle or aperture), the integrator ramps up until the end of the integration cycle or aperture, at which time the input is disconnected from the integrator. Next, a known reference current may be connected to the integrator through switch S2 and the integrator is ramped down until it crosses zero. During this time, a high-resolution counter measures the time it takes for the integrator to ramp down from where it started. This measured time, relative to the integration time and reference, is proportional to the amplitude of the input signal.

This technique is used in many high-resolution DMMs, even today. It has the advantage of simplicity and precision. With long integration times, resolution can be increased to theoretical limits. However, there are design limitations that ultimately affect product performance:

Dielectric absorption of an integrator capacitor must be compensated, even with high-quality integrator capacitors, which can require complicated calibration procedures;

The signal and the reference should be gated on and off. This process can introduce charge injection into the input signal. Charge injection can cause input-dependent errors (nonlinearity), which are difficult to compensate for at very high resolutions (6½ digits or more); and The ramp-down time can degrade the speed of measurement. The faster the ramp down, the greater the errors introduced by comparator delays, charge injection, etc.

Some topologies may use a transconductance stage prior to the integrator to convert the voltage to a current, and then use "current steering" networks to minimize charge injection. Unfortunately this added stage may introduce complexity and possible errors.

Despite these design limitations, dual-slope converters have been used in many DMMs from the most common bench or field service tools, to high-precision metrology-grade, high-resolution DMMs. As with most integrating ADC techniques, they have the advantage of providing fairly good noise rejection. Setting the integration period to a multiple of 1/PLC (power line frequency) usually causes the ADC to reject line frequency noise, which is a desirable result.

FIG. 2 (Prior Art)—Charge-Balance-with-Ramp-Down ADC

Many manufacturers overcome the dielectric absorption and speed problems inherent in dual-slope converters by using a charge-balance-with-ramp-down ADC. This technique is similar to the one used by the dual-slope converter, but instead the charge-balance-with-ramp-down ADC applies the reference signal in quantized increments during the integration cycle. This is sometimes called "modulation." Each increment represents a fixed number of final counts.

During this integration phase, represented in FIG. 2 by $t_{aperature}$, $S_1$ is turned on and $V_x$ is applied through $R_1$, which starts the integrator ramping. Opposing current is applied at regular intervals through switches $S_2$ and $S_3$. This "balances" the charge on capacitor C1. Measurement counts are generated each time $S_5$ is connected to $V_R$. In fact, for higher resolution measurements (longer integration times), most of the counts are generated during this $t_{aperature}$ phase. At the end of the charge-balance phase, a precision reference current may be applied to the integrator, as is done in the case of the dual-slope converter. The integrator is thus ramped down until it crosses zero. The measurement may be calculated from the counts accumulated during the integration, and added to the weighted counts accumulated during the ramp down. Manufacturers may use two or more ramp-down references, resulting in fast ramp-downs to optimize speed, and then slower ramp-downs for precision.

Although the integrator capacitor dielectric absorption problems are greatly improved with the charge-balance with ramp-down ADC, it has performance benefits similar to the dual-slope converter. In fact, some dual-slope converters use multiple ramp-down slopes. Speed may be greatly improved, because the number of counts generated during the charge—balance phase reduces the significance of any ramp-down error, so the ramp-down can be much faster. However, there is still significant dead time if multiple measurements are made or if a signal is digitized, because of disarming and rearming the integrator.

This type of ADC, in commercial use since the 1970s, has evolved significantly. Early versions used a modulator similar to that of a voltage-to-frequency converter. They suffered from linearity problems brought on by frequency-dependent parasitics and were thus limited in conversion speed. In the mid-1980s this technique was refined to incorporate a "constant frequency" modulator, which is still widely used today.

FIG. 3 (Prior Art)—Sigma-Delta Converters

Sigma-delta converters, or noise-shaping ADCs, have their historic roots in telecommunications. Today, the technique is largely used as the basis for commercially available off-the-shelf ADC building blocks produced by several manufacturers. Significant evolution has taken place in this arena over the last decade or so, and much research is still ongoing. Some modular DMMs (e.g., in PXI, PCI, and VXI form factors) may use sigma-delta ADCs at the heart of the acquisition engine.

The basic building blocks of a sigma-delta converter are the integrator or integrators, one-bit ADC and DAC (digital-to-analog converter), and digital filter. The noise shaping is done by the combination of the integrator stages and digital filter design. There are numerous techniques for implementing these blocks. Different philosophies exist regarding the optimum number of integrator stages, number of digital filter stages, etc. However, the basic operational building blocks remain fundamentally the same. A modulator consisting of a charge-balancing feedback loop is similar to that described above. The one-bit ADC, because of its inherent precision and monotonicity, leads the way to very good linearity.

There are advantages of using commercially available sigma-delta converters, since they are fairly linear and can offer good differential nonlinearity (DNL), their signal noise can be controlled very effectively, are inherently self-sampling and tracking with no sample-and-hold circuitry required, and are generally low in cost. However, there are some limitations to using off-the-shelf sigma-delta ADCs in high-resolution DMMs, including speed limitations due to pipeline delays through the digital filter, resolution limitations of $\leq 5\frac{1}{2}$ digit (19 bits), possible alias modulation tones in the pass band, and limited control over speed-noise tradeoffs as well as acquisition time.

It would be desirable to have an ADC with both high speed and high accuracy. For example, DMM context requires an ADC of exceptional linearity, while a signal processing context necessitates a high sample rate. These two requirements are generally in conflict with each other.

Furthermore, it would be desirable to have an ADC that allows continuous conversions to minimize dead time and maximize performance.

SUMMARY

A measurement device such as a DMM may include four basic units—an analog circuit path, an analog to digital converter (ADC), a digital filter, and an RMS computation unit. The measurement device may include a plurality of channels, where each channel may have one or more modes. The four basic units may be operable to multiplex or to process one or more of the plurality of channels at the same time.

The analog circuit path may include the necessary circuitry for the plurality of channels to couple to one or more analog signals. The analog circuit path may include one or more of an analog interface, analog signal conditioning, voltage isolation units, multiplexers, and analog filters, besides others. The analog circuit path may couple to the ADC. The ADC may be operable to receive the one or more analog signals from the analog circuit path and convert it to one or more digital signals.

The ADC may include a cascaded ADC, which may include a first ADC and a second ADC. The first and the second ADC and may be able to convert analog data to digital data during a cycle. In one embodiment, the first ADC may generate a conversion result and an error signal. The second ADC may be operable to receive the error signal, digitize the error signal, and process the error signal, thus performing noise cancellation. A summation operation may combine the data from the first ADC and processed data from the second ADC. The cascaded ADC may consist of a continuous-time 1-bit sigma-delta modulator followed by a SAR ADC. Digital output from sigma-delta modulator may be weighted and summed with output of the SAR ADC using a first logic circuit, such as an FPGA.

The first ADC may additionally include a first integrator and a second integrator. The first ADC may be operable to output a weighted sum. The weighted sum may include a combined output from the first integrator and the second integrator. The second ADC may be operable to receive the weighted sum. In addition, the second ADC may be operable to cancel out the error signal using the weighted sum.

The first ADC may also include a comparator with an input and an output. The output of the second integrator may be coupled to the input of the comparator. In addition, the first ADC may include a second logic circuit, which may control the timing of the first ADC. Data from the DAC may be re-clocked outside the second logic circuit before driving the DAC to reduce jitter.

In one embodiment, the DAC may include a first DAC and a second DAC, which may be coupled together by one or more resistors. Each of the first DAC and the second DAC may include an input and an output. The output of the first DAC and of the second DAC may be coupled to the input of the first integrator. The first DAC may be operable to generate a first output current, and the second DAC may be operable to generate a second output current. The first output current and the second output current may be combined together to generate a combined output current, which may be provided to the first integrator. The output current from the first DAC and the output current from the second DAC may be combined in such a way that the first DAC does not sense a load. In other words, the load seen by the first DAC may be substantially zero, allowing it to maintain precision and accuracy.

At low speeds, the circuit may exploit advantages of the sigma-delta converter. A lowpass filter may provide noise shaping necessary for good performance across all resolutions. No ramp down may be needed, because the sigma-delta modulator may provide high-resolution conversion instead. At high speeds, the sigma-delta modulator may combine with the second ADC to provide continuous-sample digitizing. A DSP, or another computational device, may provide one or more of real-time sequencing, calibration, linearization, AC RMS computing, decimation, and weighted noise filtering used for DC functions, besides others.

Figure 1:
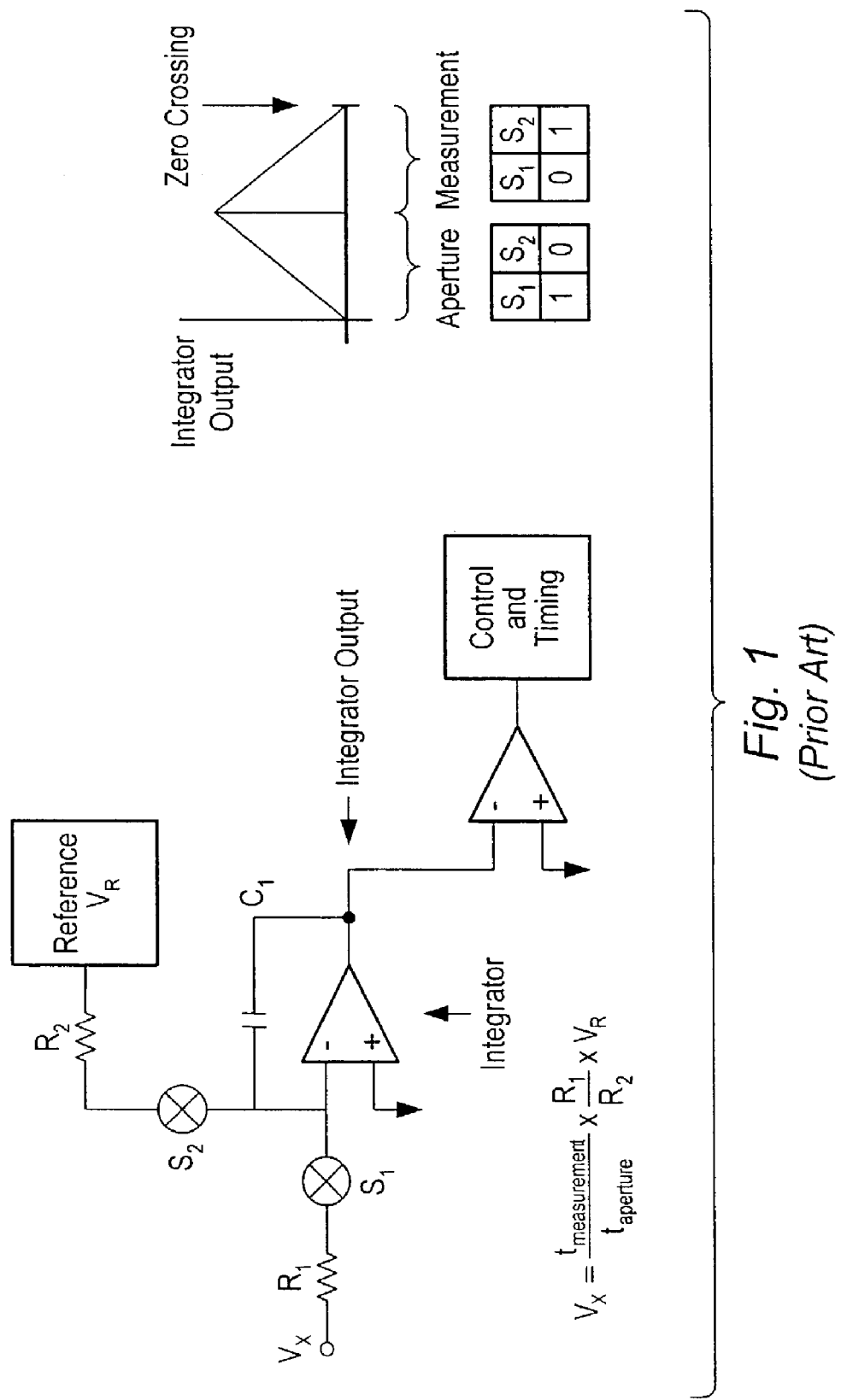
FIG. 1 illustrates a Dual-Slope Analog-to-Digital Converter, according to Prior Art.
Figure 2:
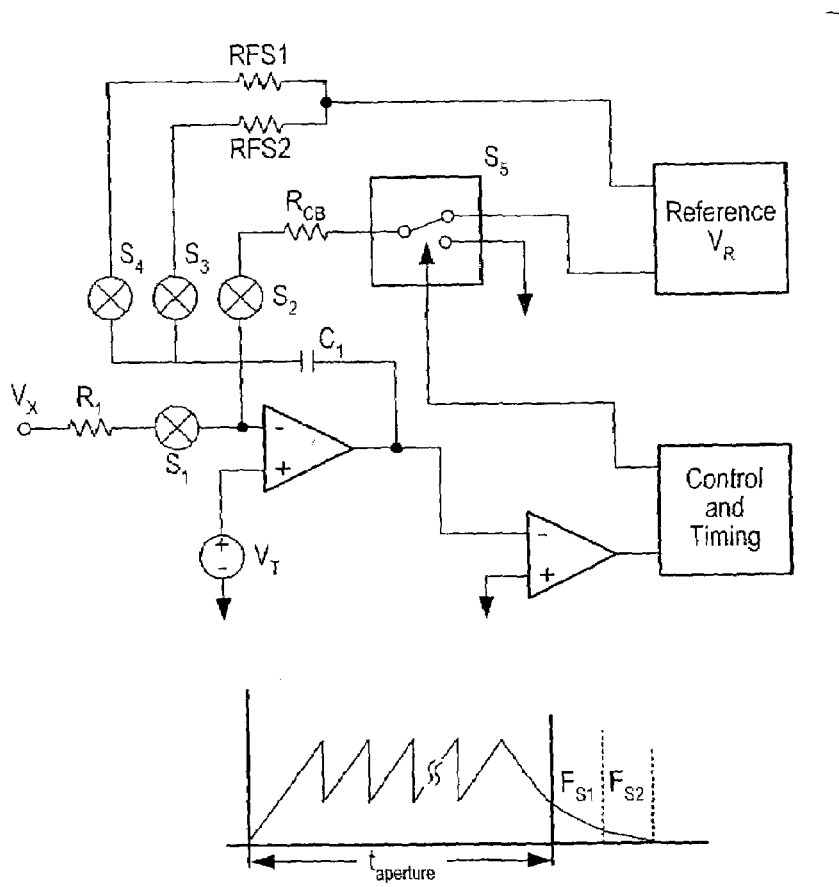
FIG. 2 illustrates a Charge-Balance-with-Ramp-Down ADC, according to Prior Art.
Figure 3:
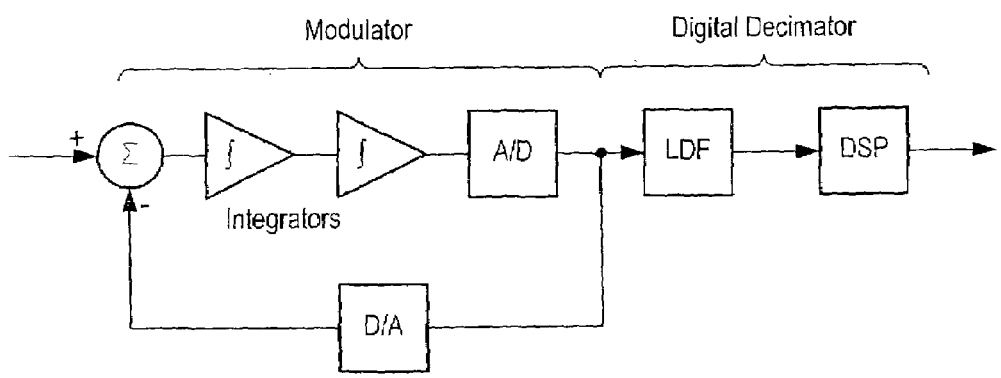
FIG. 3 illustrates a Sigma-Delta Analog-to-Digital Converter, according to Prior Art.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Please note that the headings are for organizational purposes only and are not meant to limit the description or claims.

DETAILED DESCRIPTION OF THE FIGURES

Incorporation By Reference

U.S. provisional application Ser. No. 60/403,349 titled "High-Speed High-Resolution ADC for Precision Measurements" filed Aug. 14, 2002, whose inventor was Christopher G. Regier, and which is assigned to National Instruments Corporation, is hereby incorporated by reference in its entirety.

Figure 4:
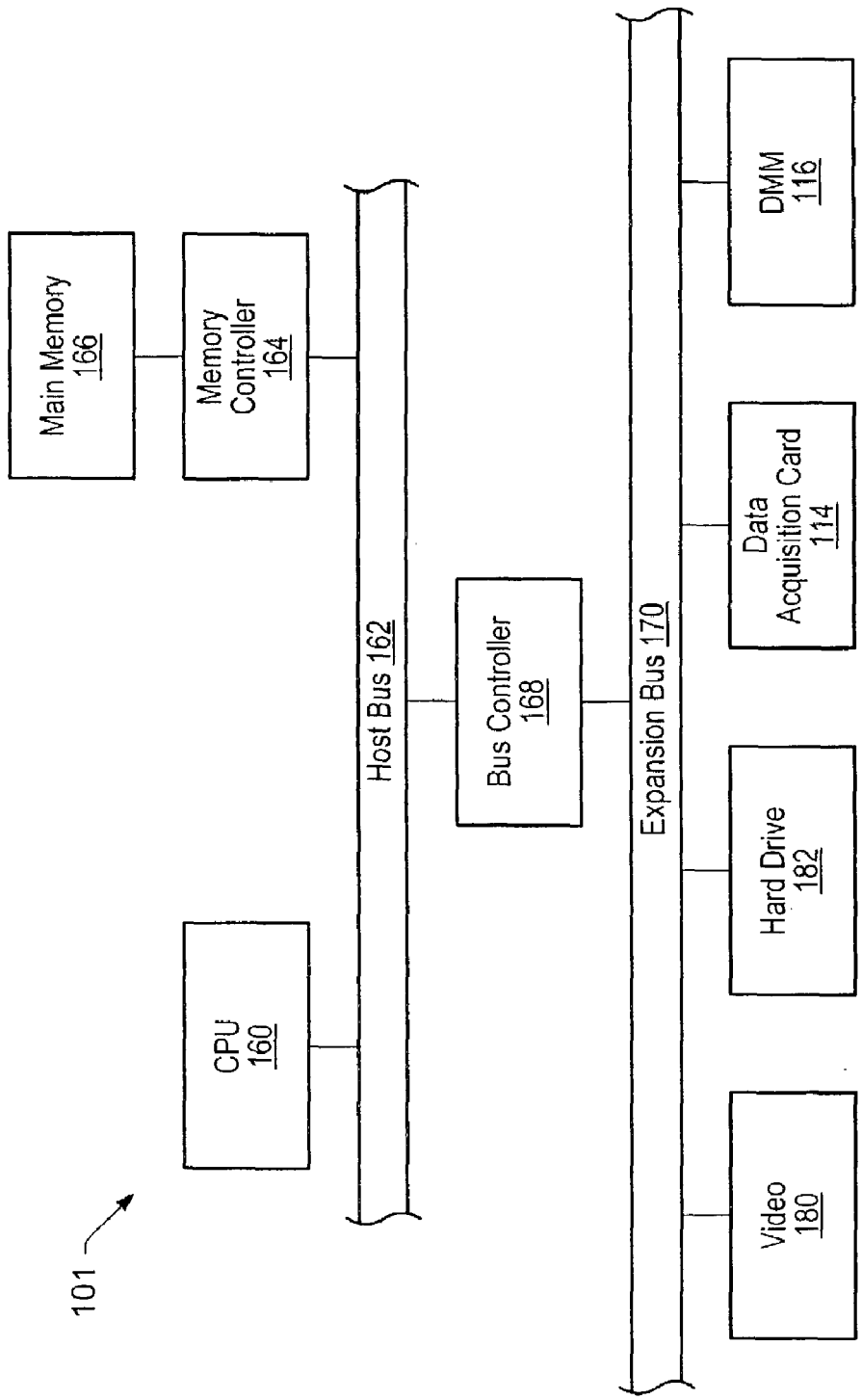
FIG. 4 illustrates a computer system block diagram, according to one embodiment.

FIG. 4—Computer System Block Diagram

FIG. 4 is a block diagram representing one embodiment of a computer system 101. It is noted that any type of computer system configuration or architecture can be used as desired, and FIG. 4 illustrates a representative PC embodiment. It is also noted that the computer system may be a general purpose computer system, a computer implemented on a VXI card installed in a VXI chassis, a computer implemented on a PXI card installed in a PXI chassis, or other types of embodiments. Elements of a computer not necessary to understand the present description have been omitted for simplicity.

The computer may include at least one central processing unit or CPU 160 which is coupled to a processor or host bus 162. The CPU 160 may be any of various types, including an x86 processor, e.g., a Pentium class, a PowerPC processor, a CPU from the SPARC family of RISC processors, as well as others. Main memory 166 may be coupled to the host bus 162 by means of a memory controller 164. The main memory 166 may store instrument drivers for communicating with DMMs, data acquisition cards, or other types of measurement devices.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used, such as ISA, VXI, PCMCIA, PC/104, PC/104+, and/or MicroDAQ. The expansion bus 170 includes slots for various devices such as measurement devices, including a data acquisition board 114 and/or a DMM 116. The computer system 101 further comprises a video display subsystem 180 and a hard drive 182 coupled to the expansion bus 170. In addition, the measurement device may be coupled to the computer system 101 by a network, such as Ethernet, USB, IEEE-1394, GPIB, RS-232/485, CAN, and/or DeviceNet, besides others.

In one embodiment, a measurement device, such as the DMM 116, may couple to a Unit Under Test, UUT (not shown). The measurement device may include a plurality of channels. Each of the channels on the measurement device may have one or more channel modes, where the mode may include coupling mode and voltage range. For example, each channel may operate in an AC or DC coupling mode. In addition, each channel may operate in one of a plurality of voltage ranges, such as ±1 Volt, ±5 Volts, and 0–5 Volts, besides others.

As noted above, various other embodiments are contemplated, such as a PXI system which includes a PXI instrument card in one or more PXI switch devices, a VXI system which includes a VXI system instrument card in one or more VXI switch devices, and other form factors including distributed I/O systems such as FieldPoint available from National Instruments.

Figure 5:
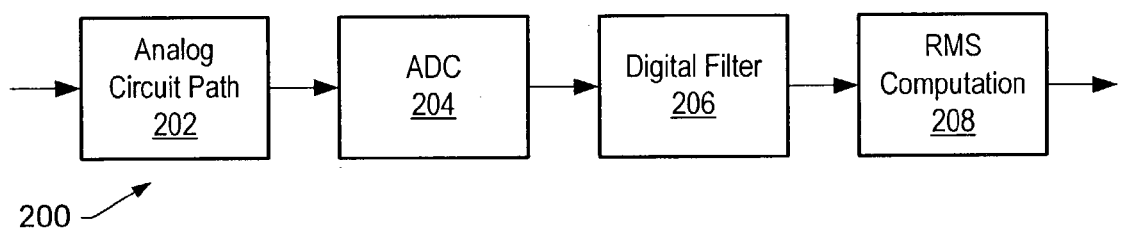
FIG. 5 illustrates a simple block diagram of a measuring device, according to one embodiment.

FIG. 5—Simple Block Diagram of a Measurement Device

FIG. 5 is a simple block diagram of a measurement device, according to one embodiment.

In one embodiment, a measurement device 200 such as a DMM 116 may include four basic units—an analog circuit path 202, an analog to digital converter (ADC) 204, a digital filter 206, and an RMS computation unit 208. As described above, the measurement device 200 may include a plurality of channels, where each channel may have one or more modes. The four basic units may be operable to multiplex or to process one or more of the plurality of channels at the same time.

The analog circuit path 202 may include the necessary circuitry for the plurality of channels to couple to one or more analog signals. The analog circuit path 202 may include one or more of an analog interface, analog signal conditioning, voltage isolation units, multiplexers, and analog filters, besides others. The analog circuit path may couple to the ADC 204. The ADC may be operable to receive the one or more analog signals from the analog circuit path 202 and convert it to one or more digital signals. The one or more digital signals may have an associated frequency response associated with it. Due to noise shaping of the ADC, it may be desirable to minimize the energy of a stop band, i.e., the frequency range outside a desired frequency range.

The ADC 204 may be coupled to a digital filter 206. The digital filter 206 may be operable to correct the frequency response in the desired frequency range (i.e., a pass band) of the one or more digital signals using filter coefficients. The digital filter unit may produce one or more corrected, or filtered, digital signals, which may be propagated to an RMS computation unit 208. In one embodiment, the digital filter includes one or more of a FIR filter and an IIR filter. In one embodiment, the digital filter may include one or more memory devices (not shown) operable to store filter coefficients.

The RMS computation unit 208 may be operable to compute the RMS of the one or more filtered digital signals.

In addition, the measurement device may include one or more memory devices. The one or more memory devices may be operable to store the digital filter coefficients. The one or more memory devices may include one or more of EEPROMs, flash memory devices, and/or any other types of non-volatile memory devices.

In one embodiment, once signals are digitized, advanced host-based functions may be implemented using a graphical program, such as LabVIEW by National Instruments, enabling one or more of the following signal characterization functions: FFT, calculating impedances, AC crest factor, peak, and AC average, besides others.

It is noted that the block diagram of FIG. 5 is exemplary only. Further, various units of FIG. 5 may be present in different order than that shown, or may not be present, as desired. Also, various additional units may be included as desired.

Figure 6:
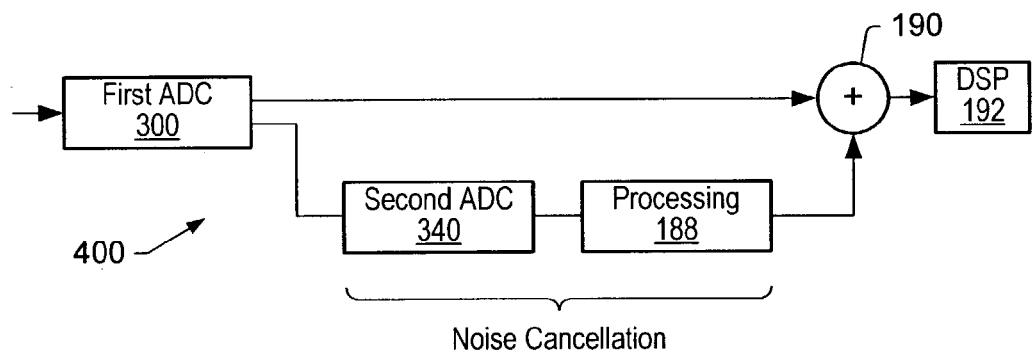
FIG. 6 illustrates a simple block diagram of a cascaded ADC, according to one embodiment.

FIG. 6—General Block Diagram of a Cascaded Analog-to-Digital Converter

FIG. 6 illustrates a General Block Diagram of a cascaded Analog-to-Digital Converter (ADC), according to one embodiment. In one embodiment, the cascaded ADC 400 may use a combination of off-the-shelf ADC technology and a custom-designed sigma-delta ADC, also referred to herein as the sigma-delta modulator. This combination may optimize linearity and noise for high precision and stability, yet offer high digitizer sampling rates. In one embodiment, the cascaded ADC 400 is the ADC 204, such as described above with reference to FIG. 5.

In one embodiment, a measuring instrument may include the cascaded ADC 400, which may include a first ADC 300 and a second ADC 340. The first and the second ADC 300 and 340 may be operable to convert analog data to digital data during a cycle. In one embodiment, the first ADC 300 may generate a data signal, also referred to herein as conversion results, and an error signal.

The second ADC 340 may be operable to receive the error signal, digitize the error signal, process the error signal, and generate processed data. The second ADC may be operable to cancel-out the noise in the digital data. A summation operation may combine the data from the first ADC 300 and the processed data from the second ADC (and the processing circuit). The summation circuit may combine the signals from the first ADC and the second ADC to generate combined data. In one embodiment, a DSP 192 may receive and further process the combined data.

AC signals may be characterized by RMS amplitude, which is a measure of their total energy. Although most DMMs may perform this nonlinear signal processing in the analog domain, in one embodiment, the cascaded ADC 400 may use an onboard digital signal processor (DSP), or another computational device, to compute the RMS value from digitized samples of the AC waveform. In one embodiment, the RMS algorithm used by the cascaded ADC may require only 4 periods (cycles) of the waveform to obtain a quiet reading. For example, it may require a measurement aperture of 4 ms to accurately measure a 1 kHz sine wave.

In one embodiment, the RMS algorithm employed by the cascaded ADC 400 may be insensitive to a DC component of the measured signal. Therefore a traditional AC coupling capacitor for blocking the DC signal component may not be necessary, although a coupling capacitor may be necessary for situations with a large DC offset. However, for applications without large DC components, such as AC power line and audio signals, the capacitor may be bypassed by using DC-coupled AC. As a result, a long time constant associated with an input coupling capacitor may be eliminated, and the signal may settle quickly.

It is noted that the block diagram of FIG. 6 is exemplary only. Further, various units of FIG. 6 may be present in different order than that shown, or may not be present, as desired. Also, various additional units may be included as desired.

Figure 7:
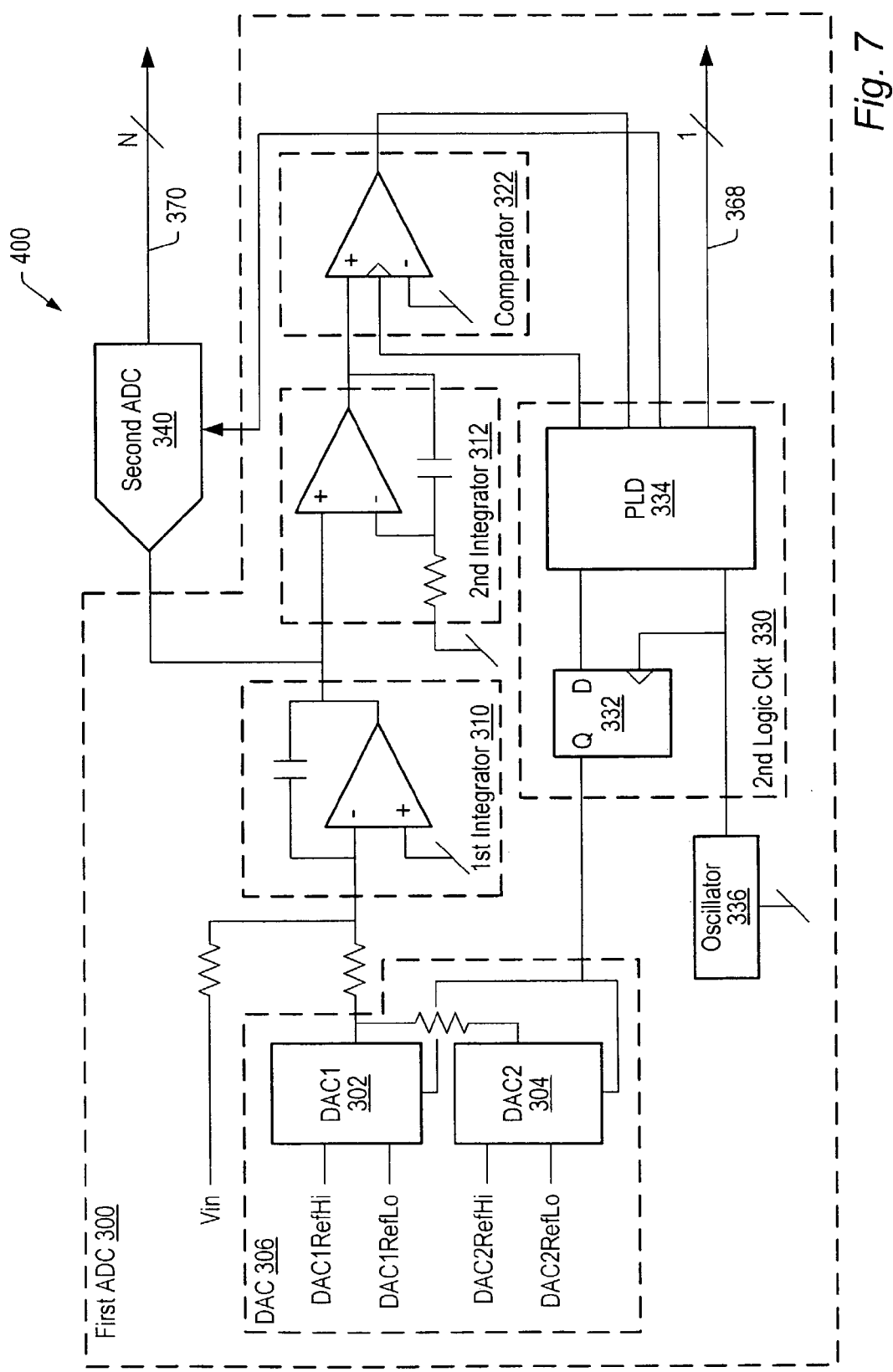
FIG. 7 illustrates a detailed block diagram of a cascaded ADC, according to one embodiment.

FIG. 7—Block Diagram of a Cascaded ADC

FIG. 7 is a block diagram of a cascaded ADC, according to one embodiment. In one embodiment, the cascaded ADC 400 is the ADC 204 referenced above with respect to FIG. 5.

In one embodiment, a measuring instrument may include the cascaded ADC 400, which may include a first ADC 300 and a second ADC 340. Each of the first ADC 300 and the second ADC 340 may include an input and an output. The first ADC 300 and the second ADC 340 may convert analog data to digital data during a cycle. The cascaded ADC 400 may also include a first logic circuit (not shown). The first logic circuit may be operable to receive the output of the first ADC 300 and the output of the second ADC 340 and produce a combined ADC output signal (not shown) that may be a combination of the first ADC output signal 368 and the second ADC output signal 370, such as described above with reference to FIG. 6. The first ADC 300 may generate an error signal that may be sampled by the second ADC 340 at a phase of the cycle when a rate of change of the error signal is independent of the conversion results for the first ADC300. In addition, the first ADC 300 may include a feedback loop that may be operable to improve ADC precision of the measuring instrument.

In other words, the first ADC 300 may generate the error signal and conversion results. In one embodiment, the error signal is of analog type, and may be digitized by the second ADC 340. In one embodiment, the first ADC may generate a 1-bit conversion result. The second ADC may produce an N-bit output signal. The first logic circuit may receive the data from the first ADC 300 and the N-bit output signal from the second ADC 340 and generate a combined ADC output signal. The first logic circuit may combine the signals from the first ADC 300 and from the second ADC 340. In other embodiments, the measuring instrument may contain a plurality of ADCs, which may be cascaded. In these embodiments, a first ADC may generate an error signal and conversion results. Each of the subsequent ADCs may measure error signals of previous one or more ADCs out of the plurality of ADCs.

In one embodiment, the first ADC 300 may include a DAC 306 with an input and an output. In one embodiment, the first ADC 300 may include one or more integrators, such as a first integrator 310 and a second integrator 312, each having an input and an output. The number of integrators in an ADC may specify order of the ADC. The output of the first integrator may be coupled to the input of the second integrator. In one embodiment, the output of the DAC 306 may be coupled to the input of the first integrator 310.

In one embodiment, the first ADC 300 may be operable to output a weighted sum. The weighted sum may include a combined output from the first integrator and the second integrator. The second ADC 340 may be operable to receive the weighted sum. In addition, the second ADC 340 may be operable to cancel out the error signal using the weighted sum. In one embodiment, only the output from the first integrator 310 may be coupled to the second ADC 340.

In one embodiment, the first ADC 300 may also include a comparator 322 with an input and an output. The output of the second integrator may be coupled to the input of the comparator 322. In addition, the first ADC 300 may include a second logic circuit 330, which may include one or more of an input, a timing input, and an output. The second logic circuit 330 may include one or more of a programmable logic device 334, such as an FPGA, or any other type of a programmable and/or configurable device, and a flip-flop circuit 332. The DAC 306 may receive timing and other inputs from the second logic circuit 330. A clock may be provided as the timing input to the second logic circuit 330, specifically coupled to the timing input of a flip-flop circuit 332 and to a timing input of the programmable logic circuit 334. The clock may be provided by an oscillator 336, a crystal, or any other clock signal generator. An input of the programmable logic device 334 may be coupled to the output of the comparator 322. An input of the flip-flop circuit 332 may be coupled to an output of the programmable logic device 334.

In one embodiment, the programmable logic device 334 may control the timing of the first ADC 300. Data from the DAC 306 may be re-clocked outside the programmable logic device 334 before driving the DAC 306 to reduce jitter. In one embodiment, one bit decision may be made every 16 clock cycles. In one embodiment, the DAC 306 may be driven low for 3 clock cycles, high for 3 clock cycles, then either high or low depending on the one bit decision for 10 clock cycles. Then the pattern may repeat. A next bit decision may be made after the last 10-clock feedback interval. The ADC 300 may sample toward the end of the 6-clock data-invariant period to reduce timing sensitivity.

In one embodiment, the DAC 306 may include a first DAC 302 and a second DAC 304, which may be coupled together by one or more resistors. Each of the first DAC 302 and the second DAC 304 may include an input and an output. The outputs from the first DAC 302 and the second DAC 304 may be coupled to the input of the first integrator 310. The first DAC 302 may be operable to generate a first output current, and the second DAC 304 may be operable to generate a second output current. The first output current and the second output current may be combined together to generate a combined output current, which may be provided to the first integrator 310. The output current from the first DAC 302 and the output current from the second DAC 304 may be combined in such a way that the first DAC 302 does not sense a load. In other words, the load seen by the first DAC 302 may be substantially zero, allowing it to maintain precision and accuracy. Put another way, the second DAC 304 may counteract the load presented by the first integrator 310 such that the first DAC 302 senses substantially no load, and therefore generates the first output current that may be substantially zero. As a result, output range of the second DAC 304 may be substantially larger than output range of the first DAC 302. In one embodiment, at least one of the first DAC 302 and the second DAC 304 includes a one-bit DAC. In one embodiment, at least one of the first DAC 302 and the second DAC 304 includes one or more CMOS logic gates.

In other words, the first ADC 300 may incorporate a 1-bit DAC for internal feedback. The 1-bit DAC may include two individual DACs, each of which may be a CMOS buffer driven by the same control signal. The first DAC 302 may drive the input of the first integrator 310 through a resistor. The second DAC 304 may drive the output of the first DAC 302 through a resistor. The reference voltages for the second DAC 304, or the supply voltages for the CMOS gate, and the resistance between the first DAC 302 and the second DAC 304 may be chosen such that the first DAC 302 drives a net current of zero, thus allowing very high accuracy.

In one embodiment, the first ADC 300 may include a first-order or higher internal feedback loop. The internal feedback loop may utilize return-to-zero coding. The first ADC may be a one-bit sigma-delta modulator. In one embodiment, the second ADC 340 may be one or more of a SAR ADC, an integrating ADC, a pipeline ADC, a flash ADC, a sub-ranging ADC, a sigma-delta ADC, and a cascaded ADC, among others. The second ADC 340 may be an off-the-shelf ADC. In one embodiment, the first ADC 302 also may be an off-the-shelf ADC.

At low speeds, the circuit may exploit advantages of the sigma-delta converter. The lowpass filter may provide the noise shaping necessary for good performance across all resolutions. No ramp down may be needed, because the sigma-delta modulator may provide high-resolution conversion instead. At high speeds, the sigma-delta modulator may combine with the ADC to provide continuous-sample digitizing. A DSP, or another computational device, may provide one or more of real-time sequencing, calibration, linearization, AC RMS computing, decimation, and weighted noise filtering used for DC functions, besides others.

It is noted that the block diagram of FIG. 7 is exemplary only. Further, various units of FIG. 7 may be present in different order than that shown, or may not be present, as desired. Also, various additional units may be included as desired.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A measuring instrument comprising:
  a first Analog-to-Digital Converter (ADC) and a second ADC, wherein each of the first and the second ADC comprises an input and an output, wherein the first ADC and the second ADC are operable to convert analog data to digital data during a cycle;
  wherein the first ADC is further operable to covert the analog data to the digital data and generate conversion results for the first ADC;
  wherein the first ADC is further operable to generate an error signal; and
  wherein the second ADC is further operable to sample the error signal, wherein said sampling occurs at a phase of the cycle when a rate of change of the error signal is independent of the conversion results for the first ADC;
  wherein the first ADC comprises an internal feedback loop, wherein the internal feedback loop is operable to use return-to-zero coding.

2. The measuring instrument of claim 1,
  wherein the measuring instrument further comprises a first logic circuit, wherein the first logic circuit is operable to receive the output of the first ADC and the output of the second ADC, and wherein the first logic circuit is further operable to produce a combined ADC output signal.

3. The measuring instrument of claim 1,
  wherein the first ADC further comprises a sigma-delta modulator;
  wherein the first ADC further comprises a DAC comprising an input and an output; and wherein the first ADC further comprises one or more integrators.

4. The measuring instrument of claim 3, wherein the first ADC further comprises a first integrator and a second integrator, wherein each of the first integrator and the second integrator comprises an input and an output, and wherein the output of the DAC is coupled to the input of the first integrator.

5. The measuring instrument of claim 4, wherein the output of the first integrator is coupled to the input of the second ADC.

6. The measuring instrument of claim 4, wherein the first ADC is further operable to output a weighted sum, wherein the weighted sum comprises at least one of the outputs from the first integrator and the second integrator, wherein the second ADC is further operable to receive the weighted sum, wherein the second ADC is further operable to cancel out the error signal using the weighted sum.

7. The measuring instrument of claim 4, wherein the first ADC further comprises:
   a comparator comprising an input and an output, wherein the second integrator is coupled to the input of the comparator;
   a second logic circuit comprising one or more of an input, a timing input, and an output, wherein the output of the comparator is coupled to the input of the second logic circuit, wherein the output of the second logic circuit is coupled to the input of the DAC; and
   a clock signal coupled to the timing input of the second logic circuit.

8. The measuring instrument of claim 7, wherein the second logic circuit comprises:
   a programmable logic device, comprising one or more of an input, a timing input, and an output, wherein the output of the comparator is coupled to the input of the programmable logic device; and
   a flip-flop circuit comprising one or more of an input, a timing input, and an output, wherein the output of the programmable logic device is coupled to the input of the flip-flop circuit.

9. The measuring instrument of claim 8, wherein the clock signal is generated by an oscillator comprising a clock output, wherein the clock output of the oscillator is coupled to the timing input of the second logic circuit; and
   wherein the clock output of the oscillator is further coupled to the timing input of the programmable logic device and to the timing input of the flip-flop circuit.

10. The measuring instrument of claim 3, wherein the DAC comprises a first DAC and a second DAC coupled together, wherein each of the first DAC and the second DAC comprises an input and an output.

11. The measuring instrument of claim 10, wherein the output of the first DAC is coupled to the input of the first integrator, wherein the output of the first DAC is further coupled to the output of the second DAC.

12. The measuring instrument of claim 11, wherein the first DAC is operable to generate a first output current and the second DAC is operable to generate a second output current, wherein the first output current and the second output current are coupled together to generate a combined output current;
wherein the combined output current is provided to the first integrator;
wherein the combined output current is operable to alter the first output current generated by the first DAC.

13. The measuring instrument of claim 12, wherein said altering the first output current comprises minimizing the first output current to substantially zero in response to the combined output current.

14. The measuring instrument of claim 10, wherein the first DAC and the second DAC are coupled together using one or more resistors.

15. The measuring instrument of claim 10, wherein range of the output of the second DAC is substantially larger than range of the output of the first DAC.

16. The measuring instrument of claim 10, wherein at least one of the first DAC and the second DAC comprises a one-bit DAC.

17. The measuring instrument of claim 10, wherein at least one of the first DAC and the second DAC comprises one or more CMOS logic gates.

18. The measuring instrument of claim 1, wherein the measuring instrument comprises the internal feedback loop;
wherein the internal feedback loop comprises a first-order or higher loop.

19. The measuring instrument of claim 1, wherein the first ADC comprises a continuous-time one-bit sigma-delta modulator.

20. The measuring instrument of claim 1, wherein at least one of the first ADC and the second ADC comprises one or more of the following:
   a SAR ADC;
   an integrating ADC;
   a pipeline ADC;
   a flash ADC;
   a sub-ranging ADC;
   a sigma-delta ADC; and
   a cascaded ADC.

21. The measuring instrument of claim 1, wherein the measuring instrument can be one or more of:
   a digital multi-meter;
   a digital volt-meter; and
   any other type of a measuring instrument operable to measure one or more of voltage and current.

22. A high-precision DAC comprising:
a first and a second DAC coupled together, wherein each of the first and the second DAC comprises an input and an output, wherein the output of the second DAC is coupled to the output of the first DAC, wherein the first DAC and the second DAC are each operable to generate and receive a load current, and wherein the load current seen by the first DAC is altered by a changing current load from the second DAC,
wherein the load current received by the first DAC is substantially zero.

23. The high-precision DAC of claim 22, wherein the first DAC and the second DAC are coupled together using one or more resistors.

24. The high-precision DAC of claim 22, wherein range of the output of the second DAC is larger than range of the output of the first DAC.

25. The high-precision DAC of claim 22, wherein the first DAC and the second DAC are comprised in a DMM operable to receive analog data, wherein the first DAC and the second DAC constitute part of an ADC in the DMM.

26. The high-precision DAC of claim 22,
wherein at least one of the first DAC and the second DAC comprises a one-bit DAC.

27. The high-precision DAC of claim 22,
wherein at least one of the first DAC and the second DAC comprises one or more CMOS logic gates.

28. The high-precision DAC of claim 22,
wherein the high-precision DAC is comprised in a measuring instrument, wherein the measuring instrument comprises an internal feedback loop, wherein the measuring instrument further comprises:
a first ADC and a second ADC, wherein the first ADC and the second ADC each comprises an input and an output, wherein the first ADC and the second ADC are operable to convert analog data to digital data during a cycle, wherein the first ADC and the second ADC are coupled together to generate a cascaded ADC;
wherein the first ADC is operable to covert the analog data to the digital data and generate conversion results for the first ADC;
wherein the first ADC is further operable to generate an error signal; and
wherein the second ADC is further operable to sample the error signal, wherein said sampling occurs at a phase of the cycle when a rate of change of the error signal is independent of the conversion results for the first ADC.

29. The high-precision DAC of claim 28,
wherein the measuring instrument further comprises a first logic circuit, wherein the first logic circuit is operable to receive the output of the first ADC and the output of the second ADC, and wherein the first logic circuit is further operable to produce a combined ADC output signal.

30. The high-precision DAC of claim 28,
wherein the first ADC further comprises a sigma-delta modulator; and
wherein the first ADC further comprises one or more integrators.

31. The high-precision DAC of claim 30,
wherein the first ADC further comprises a first integrator and a second integrator, wherein the output of the first DAC is coupled to the input of the first integrator, and wherein each of the first integrator and the second integrator comprises an input and an output.

32. The high-precision DAC of claim 31,
wherein the output of the first integrator is coupled to the input of the second ADC.

33. The high-precision DAC of claim 31,
wherein the first ADC is further operable to output a weighted sum, wherein the weighted sum comprises at least one of the outputs from the first integrator and the second integrator, wherein the second ADC is further operable to receive the weighted sum, wherein the second ADC is further operable to cancel out the error signal using the weighted sum.

34. The high-precision DAC of claim 31,
wherein the first ADC further comprises:
a comparator comprising an input and an output, wherein the second integrator is coupled to the input of the comparator;
a second logic circuit comprising one or more of an input, a timing input, and an output, wherein the output of the comparator is coupled to the input of the second logic circuit, wherein the output of the second logic circuit is coupled to the one or more of the input of the first DAC and the input of the second DAC; and
a clock signal coupled to the timing input of the second logic circuit.

35. A method for measuring analog data using a measuring instrument, the method comprising:
converting the analog data to digital data during a cycle using a first ADC and a second ADC, wherein each of the first and the second ADC comprises an input and an output, wherein the first ADC is operable to covert the analog data to the digital data and generate conversion results for the first ADC;
the first ADC generating an error signal; and
the second ADC sampling the error signal, wherein said sampling occurs at a phase of the cycle when a rate of change of the error signal is independent of the conversion results for the first ADC;
wherein the first ADC comprises an internal feedback loop, wherein the internal feedback loop is operable to use return-to-zero coding.

36. The method of claim 35,
wherein the measuring instrument comprises a first logic circuit, wherein the first logic circuit is operable to receive the output of the first ADC and the output of the second ADC, and wherein the first logic circuit is further operable to produce a combined ADC output signal.

37. The method of claim 35,
wherein the first ADC further comprises a sigma-delta modulator;
wherein the first ADC further comprises a DAC comprising an input and an output; and
wherein the first ADC further comprises one or more integrators.

38. The method of claim 37,
wherein the first ADC further comprises a first integrator and a second integrator, wherein each of the first integrator and the second integrator comprises an input and an output, and wherein the output of the DAC is coupled to the input of the first integrator.

39. The method of claim 38,
wherein the output of the first integrator is coupled to the input of the second ADC.

40. The method of claim 38,
wherein the first ADC is further operable to output a weighted sum, wherein the weighted sum comprises at least one of the outputs from the first integrator and the second integrator, wherein the second ADC is further operable to receive the weighted sum, wherein the second ADC is further operable to cancel out the error signal using the weighted sum.

41. The method of claim 37,
wherein the DAC comprises a first DAC and a second DAC coupled together, wherein each of the first DAC and the second DAC comprises an input and an output.

42. A measuring instrument comprising:
a first Analog-to-Digital Converter (ADC) and a second ADC, wherein each of the first and the second ADC comprises an input and an output, wherein the first ADC and the second ADC are operable to convert analog data to digital data during a cycle; wherein the first ADC is further operable to covert the analog data to the digital data and generate conversion results for the first ADC;
wherein the first ADC is further operable to generate an error signal; and wherein the second ADC is further operable to sample the error signal, wherein said sampling occurs at a phase of the cycle when a rate of change of the error signal is independent of the conversion results for the first ADC;

wherein the first ADC further comprises a sigma-delta modulator;

wherein the first ADC further comprises a DAC comprising an input and an output;

wherein the first ADC further comprises one or more integrators; and wherein the DAC comprises a first DAC and a second DAC coupled together, wherein each of the first DAC and the second DAC comprises an input and an output.

43. The measuring instrument of claim 42, wherein the measuring instrument further comprises a first logic circuit, wherein the first logic circuit is operable to receive the output of the first ADC and the output of the second ADC, and wherein the first logic circuit is further operable to produce a combined ADC output signal.

44. The measuring instrument of claim 42, wherein the first ADC further comprises a sigma-delta modulator;

wherein the first ADC further comprises a DAC comprising an input and an output; and wherein the first ADC further comprises one or more integrators.

45. The measuring instrument of claim 42, wherein the measuring instrument comprises an internal feedback loop;

wherein the first ADC comprises the internal feedback loop, wherein the internal feedback loop comprises a first-order or higher loop.

46. The measuring instrument of claim 45, wherein the internal feedback loop is operable to use return-to-zero coding.

47. The measuring instrument of claim 42, wherein the first ADC comprises a continuous-time one-bit sigma-delta modulator.

48. The measuring instrument of claim 42, wherein the first ADC further comprises a first integrator and a second integrator, wherein each of the first integrator and the second integrator comprises an input and an output, and wherein the output of the DAC is coupled to the input of the first integrator.

49. A measuring instrument comprising:

a first Analog-to-Digital Converter (ADC) and a second ADC, wherein each of the first and the second ADC comprises an input and an output, wherein the first ADC and the second ADC are operable to convert analog data to digital data during a cycle; wherein the first ADC is further operable to convert the analog data to the digital data and generate conversion results for the first ADC;

wherein the first ADC is further operable to generate an error signal; and wherein the second ADC is further operable to sample the error signal, wherein said sampling occurs at a phase of the cycle when a rate of change of the error signal is independent of the conversion results for the first ADC;

wherein the first ADC further comprises a sigma-delta modulator;

wherein the first ADC further comprises a DAC comprising an input and an output;

wherein the first ADC further comprises one or more integrators; and wherein the first ADC further comprises a first integrator and a second integrator, wherein each of the first integrator and the second integrator comprises an input and an output, and wherein the output of the DAC is coupled to the input of the first integrator.

* * * * *

UNITED STATES PATENT AND TRADEMARK OFFICE
CERTIFICATE OF CORRECTION

PATENT NO. : 6,970,118 B2
DATED : November 29, 2005
INVENTOR(S) : Christopher G. Regier It is certified that error appears in the above-identified patent and that said Letters Patent is hereby corrected as shown below:

Column 10,
Line 43, delete "operable to covert the" and substitute -- operable to convert the --;

Column 12,
Line 22, delete "loop;" and substitute -- loop, --;

Column 13,
Line 19, delete "operable to covert the" and substitute -- operable to convert the --;

Column 14,
Lines 11 and 62, delete "operable to covert the" and substitute -- operable to convert the --.

Signed and Sealed this

Twenty-eighth Day of February, 2006

JON W. DUDAS
*Director of the United States Patent and Trademark Office*